(12) United States Patent
Anegawa

(10) Patent No.: US 9,948,238 B2
(45) Date of Patent: Apr. 17, 2018

(54) HARMONIC MIXER HAVING TWO TRANSISTORS DRIVEN COMPLIMENTARILY

(71) Applicant: Sumitomo Electric Industries, Ltd., Osaka-shi (JP)

(72) Inventor: Osamu Anegawa, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/246,917

(22) Filed: Aug. 25, 2016

(65) Prior Publication Data

US 2017/0063345 A1  Mar. 2, 2017

(30) Foreign Application Priority Data

Aug. 27, 2015 (JP) .................................. 2015-168345

(51) Int. Cl.
*H03D 7/14* (2006.01)

(52) U.S. Cl.
CPC ......... *H03D 7/1441* (2013.01); *H03D 7/1466* (2013.01); *H03D 7/1475* (2013.01); *H03D 2200/0043* (2013.01)

(58) Field of Classification Search
None
See application file for complete search history.

(56) References Cited

U.S. PATENT DOCUMENTS

| | | | | |
|---|---|---|---|---|
| 4,320,536 A * | 3/1982 | Dietrich | ............... | H03D 9/0633 333/247 |
| 5,826,183 A * | 10/1998 | Apel | ...................... | H03B 19/14 327/122 |
| 5,832,376 A * | 11/1998 | Henderson | ............... | H03D 7/18 327/355 |
| 6,239,645 B1 * | 5/2001 | Tsukahara | ............ | H03D 7/1441 327/356 |
| 6,999,747 B2 * | 2/2006 | Su | ........................ | H03D 7/165 327/116 |
| 7,062,247 B2 * | 6/2006 | Kovacevic | ........... | H03D 7/1425 330/261 |

(Continued)

FOREIGN PATENT DOCUMENTS

JP    2011-217239 A    10/2011

OTHER PUBLICATIONS

Herbert Zirath, "A Subharmonically Pumped Resistive Dual-HEMT-Mixer," IEEE MTT-S Digest, pp. 875-878, 1991.

*Primary Examiner* — Lincoln Donovan
*Assistant Examiner* — Khareem E Almo
(74) *Attorney, Agent, or Firm* — Venable LLP; Michael A. Sartori; Kerri M. Patterson

(57) ABSTRACT

A harmonic mixer that suppresses the degradation of the conversion efficiency is disclosed. That harmonic mixer includes an input transmission line, an output transmission line, and two transistors connected in parallel between the input transmission line and the output transmission line. Two transistors are complementarily driven by a local signal LO and generate an output signal RF with frequencies of $2 \times f_{LO} \pm f_{IF}$, where $f_{LO}$ and $f_{IF}$ are frequencies of a local signal LO and an intermediate signal IF.

11 Claims, 7 Drawing Sheets

(56) References Cited

U.S. PATENT DOCUMENTS

| | | | | |
|---|---|---|---|---|
| 8,571,511 | B2* | 10/2013 | Goldfarb | H03D 7/1441 |
| | | | | 455/290 |
| 9,130,508 | B1* | 9/2015 | Kang | H03D 7/1483 |
| 2003/0119473 | A1* | 6/2003 | Smith | H03D 7/1441 |
| | | | | 455/326 |
| 2004/0121751 | A1* | 6/2004 | Shen | H03D 7/1433 |
| | | | | 455/313 |
| 2008/0169859 | A1* | 7/2008 | Garcia | H03D 7/1441 |
| | | | | 327/355 |
| 2008/0284488 | A1* | 11/2008 | Sanduleanu | H03D 7/1425 |
| | | | | 327/356 |
| 2011/0241739 | A1 | 10/2011 | Anegawa et al. | |
| 2013/0194022 | A1* | 8/2013 | Sander | H03D 7/12 |
| | | | | 327/356 |
| 2016/0336978 | A1* | 11/2016 | Trotta | H03D 7/1433 |
| 2017/0063345 | A1* | 3/2017 | Anegawa | H03D 7/1441 |
| 2017/0093338 | A1* | 3/2017 | Lin | H03D 7/1458 |
| 2017/0111011 | A1* | 4/2017 | Lin | H03D 7/1458 |
| 2017/0207749 | A1* | 7/2017 | Lin | H03D 7/1441 |
| 2017/0264323 | A1* | 9/2017 | Trotta | H04B 1/0475 |

\* cited by examiner

HARMONIC MIXER HAVING TWO TRANSISTORS DRIVEN COMPLIMENTARILY

CROSS-REFERENCE TO RELATED APPLICATION

This application is based upon and claims the benefit of priority of the prior Japanese Patent Application No. 2015-168345, filed on Aug. 27, 2015, the entire contents of which are incorporated herein by reference.

BACKGROUND (i) Technical Field

A certain aspect of the embodiments discussed herein relates to a harmonic mixer.

(ii) Related Art

It is generally hard or almost impossible to get a local source showing stable oscillation with enough power in millimeter wavelengths or in quasi-millimeter wavelengths, where the millimeter wavelengths means wavelengths around several millimeters while the quasi-millimeter wavelengths means around several scores of millimeters, which results in a use of a mixer operable in relative lower frequencies and extracting harmonics of a fundamental oscillation as disclosed by Herbert in IEEE MTT-S Digest in 1991, which is often called as a harmonic mixer.

SUMMARY

A harmonic mixer turns on/off a transistor by a local signal (LO) to mix two signals. The conversion efficiency of a harmonic mixer may be determined by a ratio of an equivalent resistance of the transistor at turning off against that at turning on. Accordingly, larger inductive components attributed to interconnections around the transistor, which increases equivalent impedance thereof, may degrade the conversion efficiency. In particular, the inductive components become substantial, considerably large, in the millimeter and quasi-millimeter wavelengths, which drastically degrade the conversion efficiency of the harmonic mixer.

An aspect of the present invention relates to a harmonic mixer that mixes a local signal LO with an intermediate signal IF to output an output signal RF that provides frequency components primarily of $2 \times f_{LO} \pm f_{IF}$, where $f_{LO}$ and $f_{IF}$ are frequencies of the local signal LO and the intermediate signal IF, respectively. The harmonic mixer of an embodiment includes an input transmission line coupled to an input terminal that receives the intermediate signal IF; an output transmission line coupled to an output terminal that outputs the output signal RF; and first and second transistors where two transistors are connected in parallel to each other between the input transmission line and the output transmission line. A feature of the harmonic mixer of the present invention is that the two transistors are complimentarily driven by the local signal LO.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION

Next, some examples of the present invention will be described as referring to drawings. In the description of the drawings, elements or symbols same with or similar to each other will refer to elements same with or similar to each other without duplicating explanations.

First Embodiment

Figure 1:
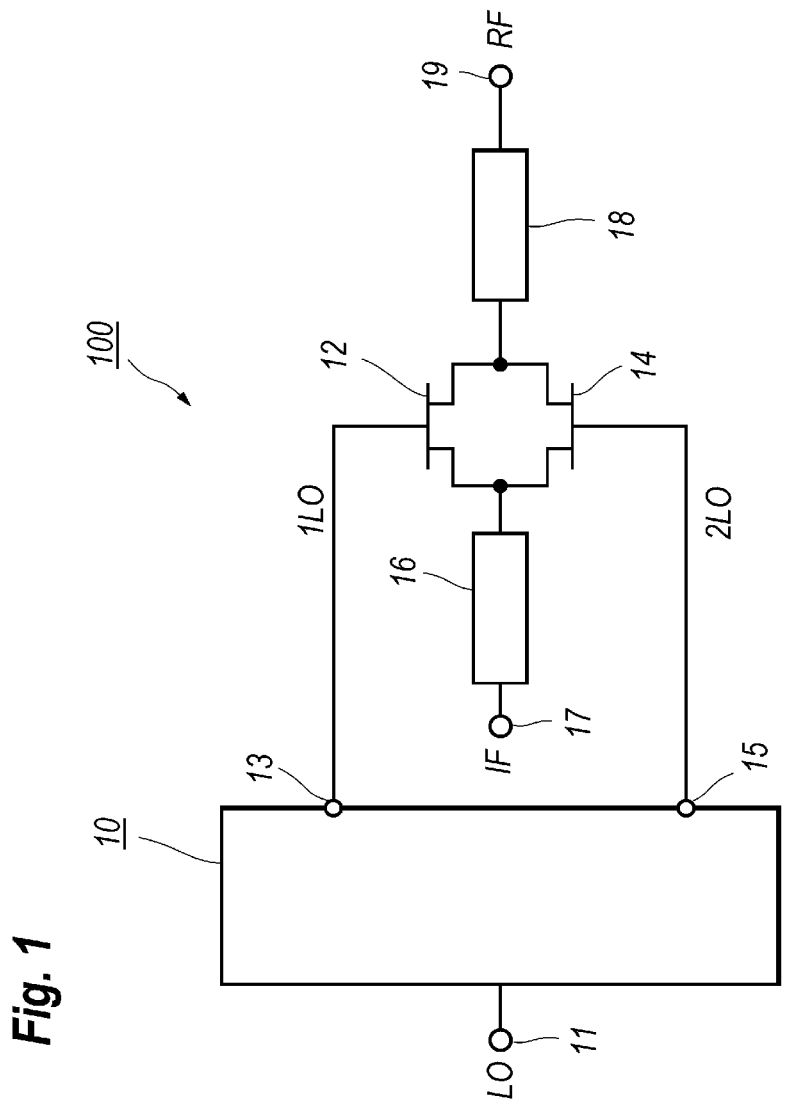
FIG. 1 shows a circuit diagram of a harmonic mixer according to a first embodiment of the present invention.

FIG. 1 shows a circuit diagram of a circuit of a harmonic mixer according to a first embodiment of the present invention. A harmonic mixer 100 includes a balun 10, two transistors, 12 and 14, and two transmission lines, 16 and 18. The balun 10 receives a local signal LO input to a terminal 11 and outputs a first local signal 1LO and a second local signal 2LO in respective terminals, 13 and 15. These two local signals, 1LO and 2LO, are complementary to each other, having phases opposite to each other, namely, a phase difference of about 180°. The transmission lines, 16 and 18, may have an arrangement of a micro-strip line and/or a coplanar line, that is, the transmission lines, 16 and 18, have specific impedance.

Two transistors, 12 and 14, which may be a field effect transistor (FET), receive the first and second local signals, 1LO and 2LO, in respective gates, which are control terminals of the transistors, 12 and 14. Also, these two transistors, 12 and 14, in respective drains, which are the first current terminals, receive an intermediate signal IF provided in an input terminal 17 through the input transmission line 16, and in respective sources, which are the second current terminals, outputs an output signal (RF) in an output terminal 19 through the output transmission line 18. The output signal RF has a frequency determined by the intermediate signal IF and twice the frequencies of the first and second local signals, 1LO and 2LO. That is, assuming $f_{LO}$ to be frequencies of the first local signal 1LO and the second local signal 2LO, and $f_{IF}$ to be the frequency of the intermediate signal IF; then, the output signal RF primarily contains frequency components of $2 \times f_{LO} \pm f_{IF}$.

Figure 2:
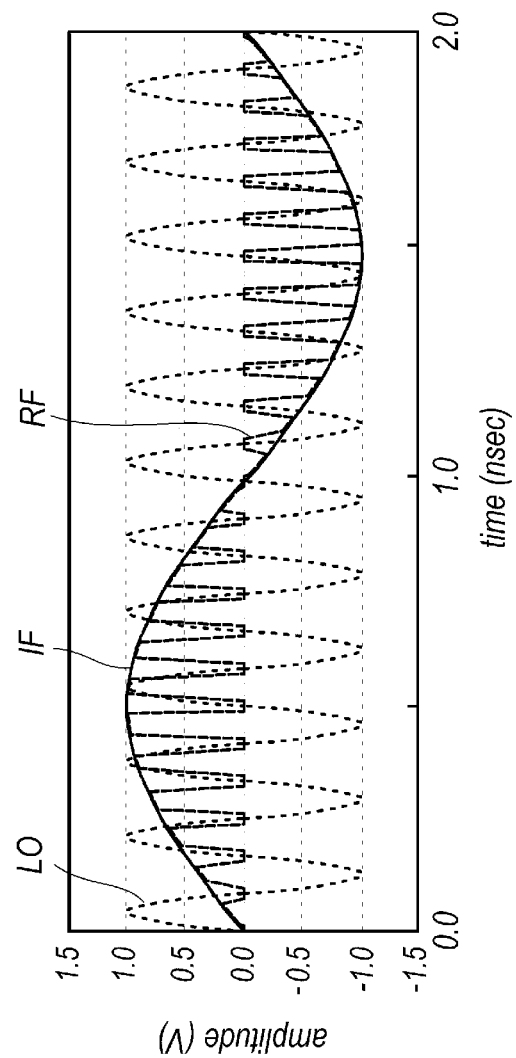
FIG. 2 shows typical behaviors of a local signal LO, an intermediate signal IF and an output signal RF indicated in FIG. 1.

FIG. 2 shows typical waveforms of the local signal LO, the intermediate signal IF and the output signal RF shown in FIG. 1, where a dotted line, a solid line, and a broken line correspond to the local signal LO, the intermediate signal IF and the output signal RF, respectively. The horizontal axis in FIG. 2 corresponds to time in nano-second, while, the vertical axis shows the amplitude of the respective signals, LO, IF, and RF, in an electrical potential.

The transistors, 12 and 14, which turn on and off by the local signals, 1LO and 2LO, by using a magnitude of 0.5 V as a threshold. Specifically, the transistors, 12 and 14, turn on when the local signals, 1LO and 2LO, exceed 0.5 V, and turn off when the local signals, 1LO and 2LO, become smaller than 0.5 V. As described, because the local signals, 1LO and 2LO, have phases opposite to each other, the transistors, 12 and 14, iterate turning on and off complimentarily. Also, periods when both local signals, 1LO and 2LO, become lower than 0.5 V appear, that is, two transistors, 12 and 14, are commonly turned off during these moments. In such moments, the intermediate signal IF is reflected by the transistors, 12 and 14, and the output signal RF becomes zero. When at least one of the transistors, 12 and 14, turns on, the intermediate signal IF appears in the output terminal 19 through the input transmission line 16, one of the transistors, 12 and 14, and the output transmission line 18. Accordingly, the second harmonics of the local signal LO appears in the output signal RF. Thus, the output signal RF mixes or multiplexes a signal having a frequency twice the frequency of the local signal LO with the intermediate signal IF as shown in FIG. 2. As FIG. 2 clearly shows that the local signal LO has a frequency higher than that of the intermediate signal IF; thus, the circuit shown in FIG. 1 may operate as a harmonic mixer by up-converting the intermediate signal IF.

The harmonic mixer 100 of the first embodiment may generate the output signal RF that mixes the intermediate signal IF with the local signal LO having a frequency $f_{LO}$. The output signal RF contains frequency components primarily twice the frequency $f_{LO}$ of the local signal LO by turning on and off two transistors, 12 and 14, complimentarily. The transistors, 12 and 14, have no inductors connected in series thereto. Even though parasitic inductors are inherently connected in series to the transistors, 12 and 14, such parasitic inductors are regarded to be connected between the transistors, 12 and 14, and the output transmission line 18, and are not connected to the ground. Accordingly, the harmonic mixer 100 may suppress the degradation of the conversion efficiency thereof.

Figure 3:
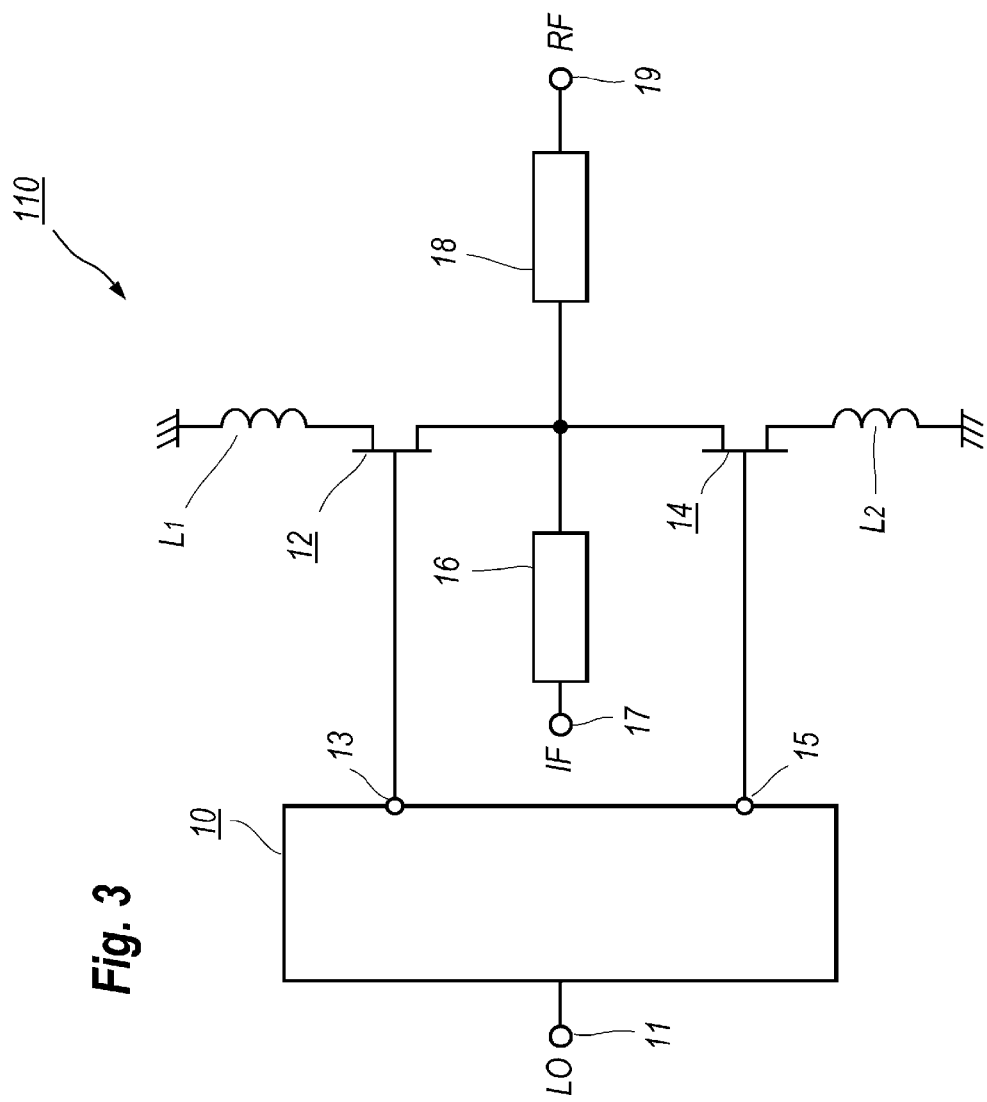
FIG. 3 shows a circuit diagram of a harmonic mixer comparable to the harmonic mixer of the embodiment shown in FIG. 1.

Next, a harmonic mixer comparable to the harmonic mixer 100 shown in FIG. 1 will be described. FIG. 3 shows a circuit diagram of a harmonic mixer 110 comparable to the present invention. The harmonic mixer 110 also provides two transistors, 12 and 14, having drains commonly connected to each other. The drains receive the intermediate signal IF through the transmission line 16. The drains are also commonly connected to the output terminal 19 for outputting the output signal RF. The sources of the transistors, 12 and 14, are grounded through respective inductors, $L_1$ and $L_2$, where the inductors, $L_1$ and $L_2$, primarily denote parasitic components of interconnections from the sources to the ground. Two transistors, 12 and 14, in the comparable harmonic mixer 110 also iterate turning on and off complimentarily. When one of the transistors, 12 and 14, turns on, the commonly connected drains are grounded through turned on the transistor, 12 or 14, which means the intermediate signal IF is reflected thereat and the output signal RF becomes zero. On the other hand, during periods where both transistors, 12 and 14, turn off, the commonly connected drains thereof become float from the ground, and the intermediate signal IF appears in the output terminal 19 as the output signal RF passing through the transmission lines, 16 and 18.

However, the comparable harmonic mixer 110 provides the inductors, $L_1$ and $L_2$, connected in series to the transistors, 12 and 14. Accordingly, when the transistors, 12 and 14, turn on, the inductors, $L_1$ and $L_2$, are connected in series to respective transistors, 12 and 14, between the node common to the transistors, 12 and 14, and the ground, which means that the transistors, 12 and 14, are grounded through substantial impedance due to the inductors, $L_1$ and $L_2$, and the common node is not exactly grounded. Substantial impedance reduces the reflection of the intermediate signal IF at the common node, and a portion of the intermediate signal IF appears in the output signal RF at the output terminal 19 when at least one of the transistors, 12 and 14, turns on, which means that the amplitude of the output signal RF reduces and the conversion efficiency of the harmonic mixer 110 degrades.

The inductors, $L_1$ and $L_2$, are derived from parasitic components of interconnections coupled to the sources of the transistors, 12 and 14. When the transistors, 12 and 14, have a structure where the sources thereof are directly grounded through via holes, the parasitic inductive components of such interconnections may be decreased. However, even when the sources are directly grounded, the parasitic inductive component derived from those via holes is ultimately left, and the degradation of the conversion efficiency remains.

The transistors, 12 and 14, in the first embodiment are not grounded in any modes, that is, the transistors, 12 and 14, are put between the input terminal 17 for the intermediate signal IF and the output terminal 19 for the output signal RF. Even when the parasitic inductive components around the transistors, 12 and 14, are substantially left, the impedance corresponding to the parasitic inductive components may affect the transmission impedance of the transmission lines, 16 and 18, but the parasitic inductive components are not connected to the ground. Accordingly, the circuit of the harmonic mixer 100 may show enhanced conversion efficiency.

Second Embodiment

Figure 4:
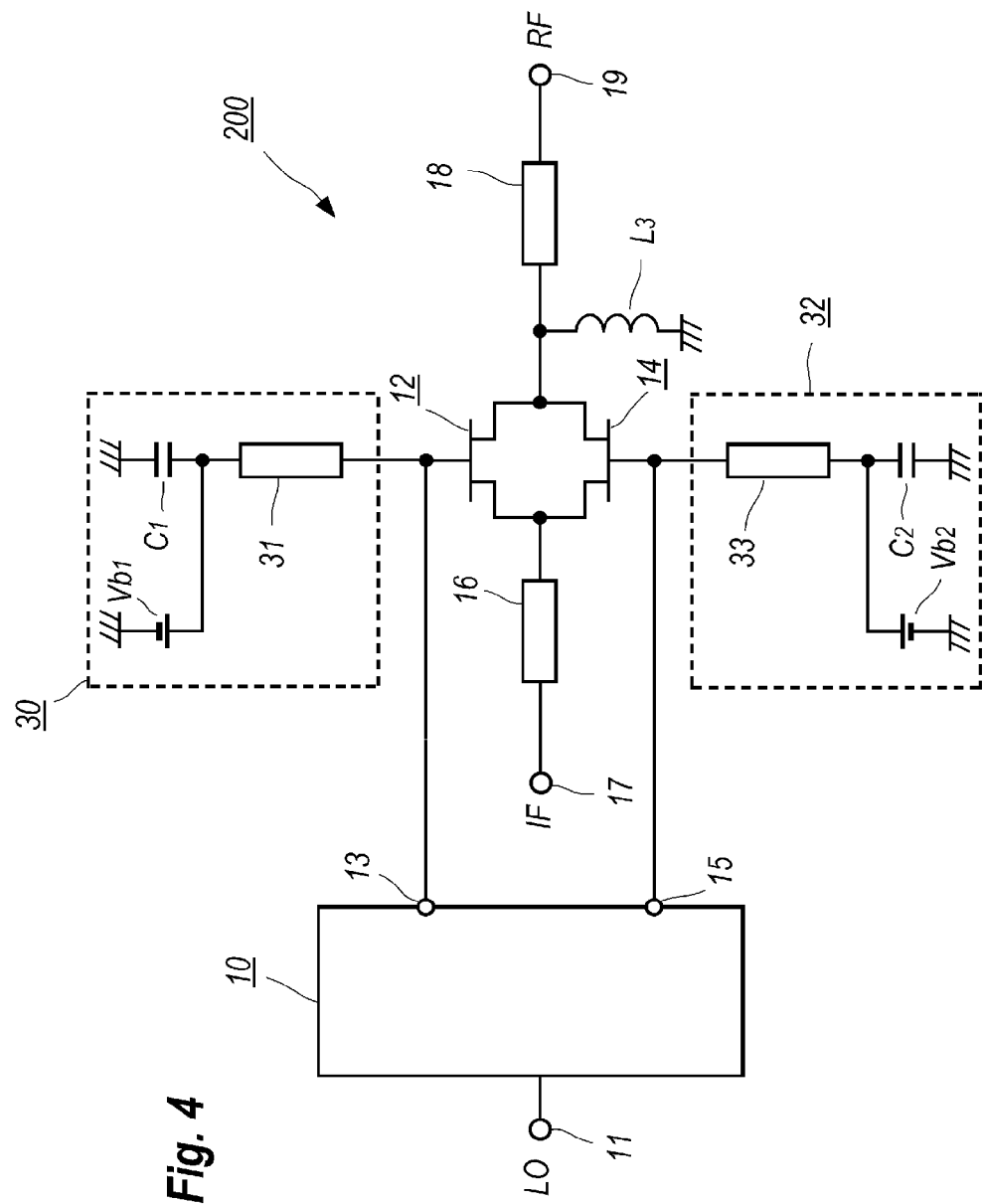
FIG. 4 shows a circuit diagram of a harmonic mixer according to a second embodiment of the present invention.

A second embodiment of the present invention shown in FIG. 4 provides, in addition to the components of the first embodiment shown in FIG. 1, an inductor $L_3$ and bias circuits, 30 and 32. The inductor $L_3$, which is connected between the two transistors, 12 and 14, and the ground, may ground the transistors, 12 and 14, in the DC mode, but may be substantially regarded as an open circuit for high frequency signals such as the output signal RF. The bias circuit 30 includes a transmission line 31 and a capacitor $C_1$, and provides a bias voltage $Vb_1$, while the bias circuit 32 includes a transmission line 33 and a capacitor $C_2$, and provides a bias voltage $Vb_2$. The transmission lines, 31 and 33, are respectively coupled to the gates of the transistors, 12 and 14, in first ends thereof; while, second ends of the transmission lines, 31 and 33, are grounded through the capacitors, $C_1$ and $C_2$. The bias voltages, $Vb_1$ and $Vb_2$, are provided to the gates of the transistors, 12 and 14, through the transmission lines, 31 and 33.

The transmission lines, 31 and 33, have electrical lengths of a quarter wavelength of the local signal LO, which means that the transmission lines, 31 and 33, may be regarded as an open circuit for the local signal LO. The capacitors, $C_1$ and $C_2$, may have capacitance enough large such that the impedance calculated by an equation of $1/\omega c$ becomes small enough, where $\omega = 2 \cdot \pi \cdot f_{LO}$ and C is the capacitance of the capacitors, $C_1$ and $C_2$. Thus, the transmission lines, 31 and 33, may be regarded as an inductor put between the gates and the ground, and having inductance enough large for the local signals, 1LO and 2LO. Thus, the bias voltages, $Vb_1$ and $Vb_2$, may be isolated from the transistors, 12 and 14, and the local signals, 1LO and 2LO, in the AC mode. In other words, the transmission lines, 31 and 33, prevent the local signals, 1LO and 2LO, from leaking to the bias circuits, 30 and 32.

The harmonic mixer 200 of the second embodiment provides the inductor $L_3$ in the sources of the transistors, 12 and 14. The inductor $L_3$ may be regarded as the short circuit at frequencies far smaller than those of the local signal LO, the intermediate signal IF, and the output signal RF. Simultaneously, the inductor $L_3$ may be regarded as an open circuit at frequencies of the local signal LO, the intermediate signal IF, and the output signal RF. Thus, the inductor $L_3$ may show no contribution to the mixing function of the harmonic mixer 200 but make the operation in the DC mode stable because the transistors, 12 and 14, may be regarded to be grounded through the inductor $L_3$ at lower frequencies.

Also, the inductor $L_3$ is connected on the path from the transistors, 12 and 14, to the output terminal 19. Accordingly, the inductor $L_3$ gives no contribution to an increase of the transmission impedance, which means that the inductor $L_3$ may not degrade the conversion efficiency of the harmonic mixer 200.

In order to ground the transistors, 12 and 14, in the DC mode, another inductor $L_3'$ instead of the inductor $L_3$ may be connected between the transmission line 16 and the ground in the upstream of the transistors, 12 and 14. In such a configuration, the substituted inductor $L_3'$ is necessary to have inductance such that the impedance of the inductor $L_3'$ becomes large enough at frequencies around the frequency of the intermediate signal IF, which is considerably smaller than those of the local signal LO and the output signal RF. Accordingly, the substituted inductor $L_3'$ in the inductance thereof is forced to occupy a larger area compared to that for the inductor $L_3$, which enlarges physical dimensions of the harmonic mixer 200. Thus, the inductor $L_3$ to stabilize the operation of the transistors, 12 and 14, is preferably provided downstream of the transistors, 12 and 14.

Third Embodiment

Figure 5:
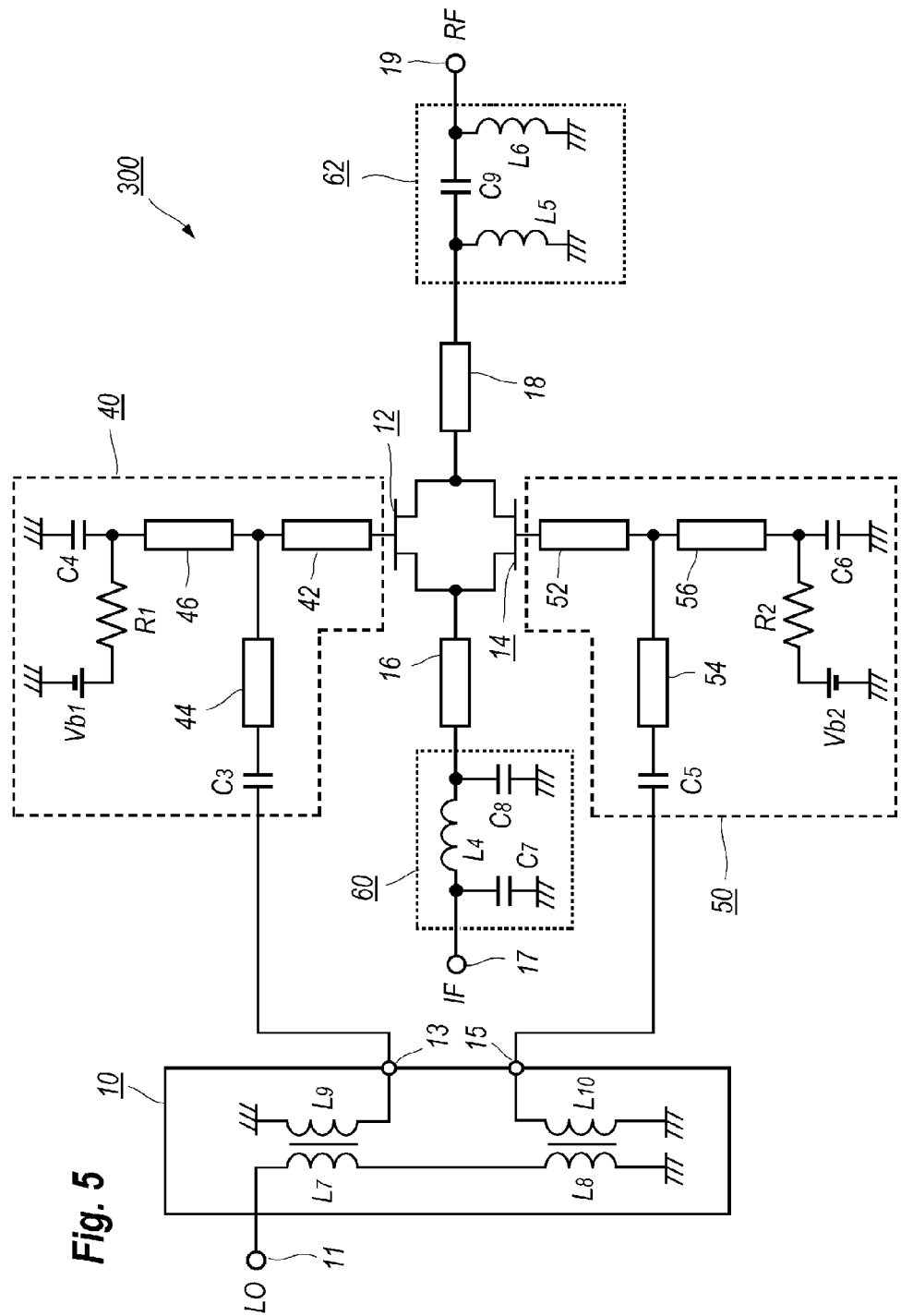
FIG. 5 shows a circuit diagram of a harmonic mixer according to a third embodiment of the present invention.

A harmonic mixer according to a third embodiment of the present application provides, in addition to the arrangement of the harmonic mixers 100 and 200, filters, 60 and 62, as shown in FIG. 5, where FIG. 5 schematically illustrates a practical arrangement of the balun 10 including four inductors, $L_7$ to $L_{10}$. A bias circuit 40, which is similar to the aforementioned bias circuit 30, further includes two transmission lines, 42 and 44, and a resistor $R_1$. Two transmission lines, 42 and 44, compensate mismatching between the output impedance of the balun 10, namely, the impedance viewing the balun 10 from the transistor 12, and the input impedance of the transistor 12 viewed from the balun 10. The last transmission line 46 may isolate the bias voltage $Vb_1$ from the local signal LO.

The other bias circuit 50 operates the same as the bias circuit 40. That is, the bias circuit 50 further includes, in addition to the bias circuit 32 of the previous embodiment, two transmission lines, 52 and 54, and a resistor R2. Two transmission lines, 54 and 56, may compensate the mismatching between the output impedance of the balun 10 and the input impedance of the transistor 14. The last transmission line 56 also isolates the bias voltage $Vb_2$ from the local signal LO. The transmission lines, 42 to 56, may have characteristic impedance of, for instance, 50Ω. The inductors and the capacitors used in a harmonic mixer 300 shown in FIG. 5 may be inductive transmission lines and capacitive transmission lines at respective frequencies.

The filter 60, which is, what is called, a low-pass filter, includes an inductor $L_4$ and two capacitors, $C_7$ and $C_8$, where these elements constitute a π (pi) arrangement. That is, the inductor $L_4$ is connected between the capacitors, $C_7$ and $C_8$, while the capacitors, C7 and C8, in first terminals thereof, are grounded. The filter 60 allows the intermediate signal IF incoming from the input terminal 17 and outgoing to the transistors, 12 and 14, to pass therethrough, and blocks the local signal LO coming from the transistors, 12 and 14, to the input terminal 17. The filter 60 may also compensate the impedance mismatching of the input terminal 17, exactly, the transmission impedance of a line connected to the input terminal 17 and the transistors, 12 and 14.

The other filer 62, which may operate as, what is called, a high-pass filter, includes two inductors, $L_5$ and $L_6$, and a capacitor $C_9$, where these elements also constitute the π (pi)-arrangement. That is, the capacitor $C_9$ is connected between the inductors, $L_5$ and $L_6$, while the inductors, $L_5$ and $L_6$, in the other terminals thereof, are grounded. The filter 62 may allow the output signal RF coming from the transistors, 12 and 14, and outgoing to the output terminal 19 to pass therethrough but block the intermediate signal IF. The filter 62 may also compensate the impedance mismatching between the transistors, 12 and 14, and the output terminal 19, exactly, the transmission impedance of a line connected to the output terminal 19.

The balun 10 is a type of, what is called, the Marchand balun that may include four (4) inductors, $L_7$ to $L_{10}$, configured by transmission lines each having a length of a quarter wavelength λ/4 of the local signal LO, where two transmission lines, $L_7$ and $L_9$, and other two transmission lines, $L_8$ and $L_{10}$, cause the capacitive coupling. The local signal LO enters the transmission line $L_7$. The terminal 13 outputs the first local signal 1LO whose phase is different by 90° from that of the local signal LO, while the other terminal 15 outputs the second local signal 2LO whose phase is different by 270° from that of the local signal LO. Thus, two local signals, 1LO and 2LO, may have the phase difference of 180°. In FIG. 5, one end of the transmission line L8 is grounded, but this end may be opened. That is, this end fully reflects the local signal LO entering the transmission line $L_8$ therein.

Next, performance of the harmonic mixer 300 will be evaluated. Parameters used in the evaluation are shown within a table below.

TABLE

| parameters used in evaluation | | |
|---|---|---|
| resistor | $R_1$, $R_2$ | 1010 kΩ |
| capacitor | $C_3$, $C_5$ | 0.009 pF |
| | $C_4$, $C_6$ | 1.15 pF |
| | $C_7$, $C_8$ | 1 pF |
| | $C_9$ | 0.16 pF |
| inductor | $L_4$ | 2.9 nH |
| | $L_5$, $L_6$ | 0.42 nH |
| transmission line | 42, 52 | 0.206 λ |
| | 44, 54 | 0.072 λ |
| | 44, 56 | 0.025 λ |
| transistor | gate width | 40 μm |
| | gate finger | 2 |
| local signal | 1LO, 2LO | f = 10 GHz |
| | | p = −4 dBm |
| intermediate signal | IF | f = 2 GHz |
| | | p = −3 dB |

In the table above, λ represents the wavelengths of the local signals, 1LO and 2LO.

Figure 6:
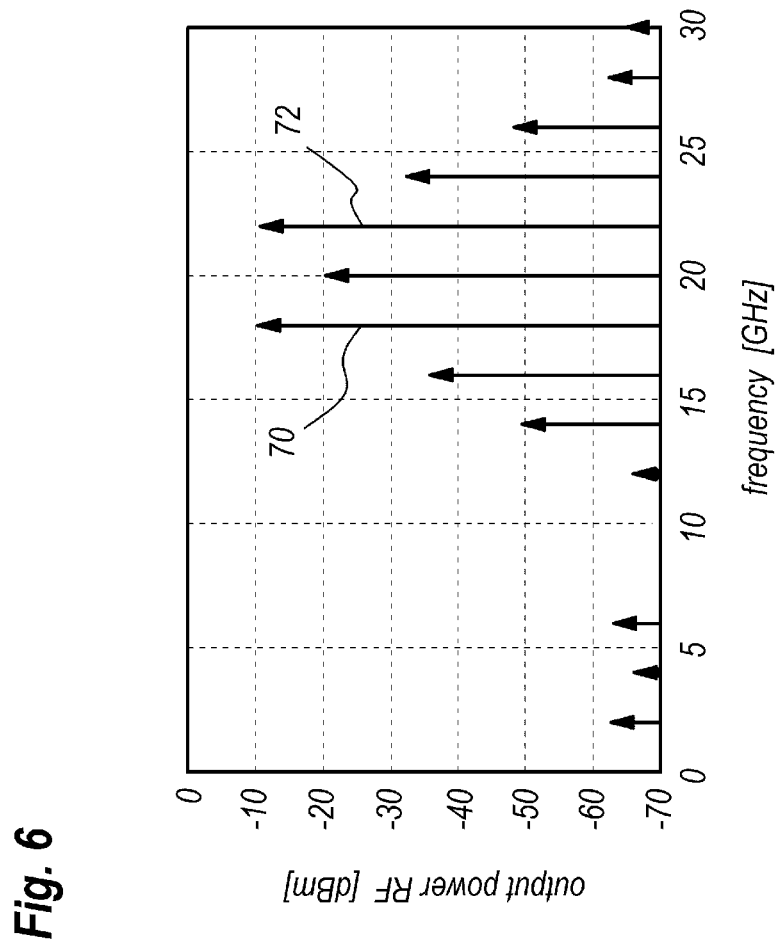
FIG. 6 shows an example of an output spectrum of the output signal RF evaluated for the harmonic mixer shown in FIG. 5.

FIG. 6 shows a result of the evaluation for the harmonic mixer 300. A horizontal axis in FIG. 6 denotes a frequency in the unit of giga-hertz (GHz), and a vertical axis corresponds to output power in the unit of dBm of respective frequency components contained in the output signal RF. As shown in FIG. 6, frequency components at 18 and 22 GHz have a power of −10 dBm, which is considerably greater than the power of other components appearing in a span of 2 GHz. These behaviors of the frequency components reflect that the harmonic mixer 300 may mix two local signals, 1LO and 2LO, with the intermediate signal IF. Thus, the harmonic mixer 300 of the present embodiment may mix the local signal LO with the intermediate signal IF by suppressing degradation in the conversion efficiency and output the output signal RF containing frequency components attributed to the mixing. Also, because the harmonic mixer 300 provides the low-pass filter 60 in the upstream of the transistors, 12 and 14, and the high-pass filter 62 in the downstream of the transistors, 12 and 14. The low-pass filter 60 may allow the intermediate signal IF to pass therethrough but effectively block the local signal, 1LO or 2LO, while, the high-pass filter may allow the output signal RF to pass therethrough but effectively eliminate the intermediate signal IF, which may also contribute to the enhancement of the conversion efficiency and the increase in the output power of the output signal RF.

Fourth Embodiment

Figure 7:
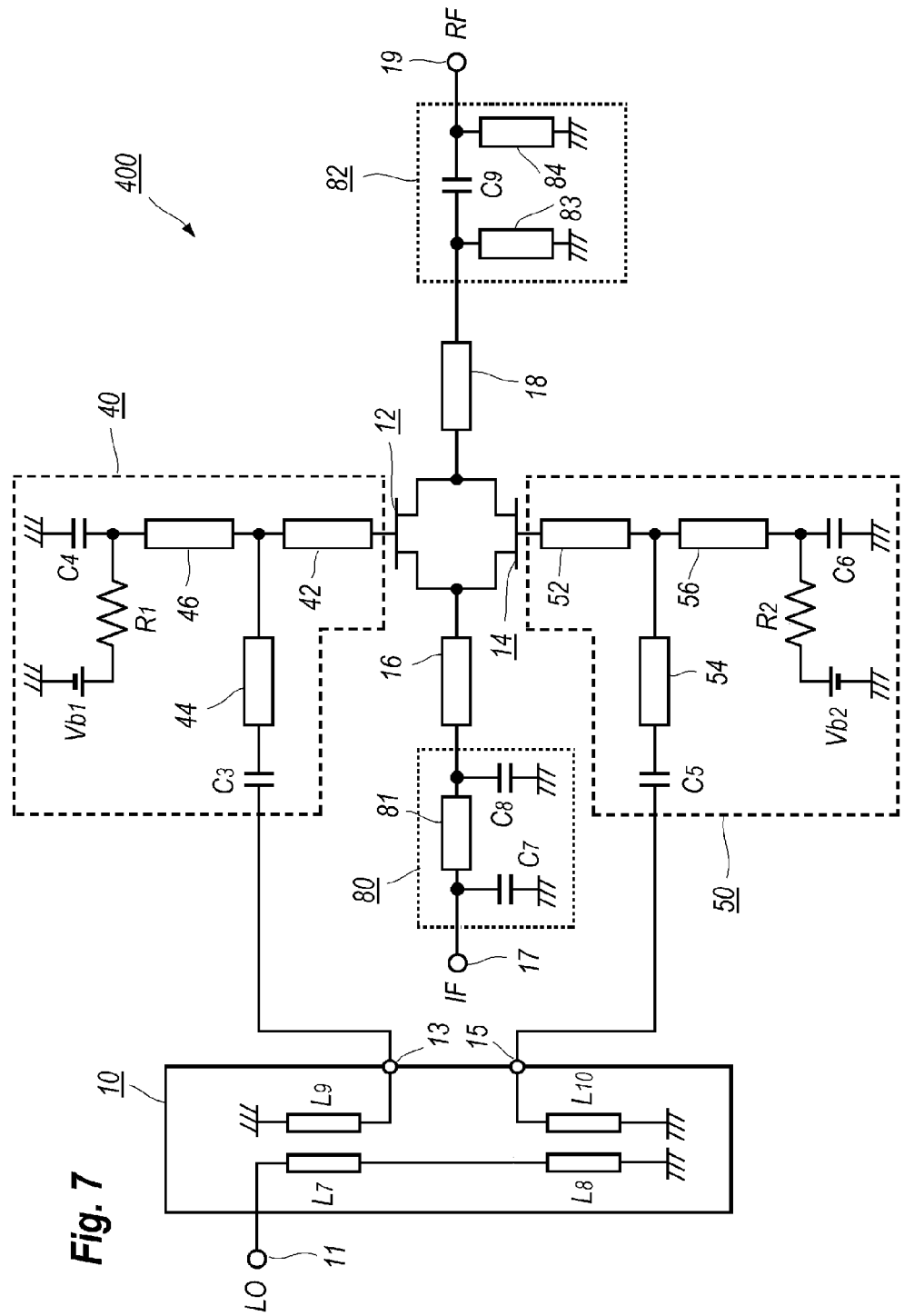
FIG. 7 shows a circuit diagram of a harmonic mixer according to a fourth embodiment of the present invention.

An electronic circuit according to a fourth embodiment of the present application substitutes distributed constant elements for the inductors. As FIG. 7 shows, an electronic circuit 400, which is also a harmonic mixer, provides a low-pass filter 80 and a high-pass filter 82 each including transmission lines substituting for the inductors. In FIG. 7, the Marchand balun 10 has transmission lines, $L_7$ to $L_{10}$, instead of the inductors.

The low pass filter 80 includes a transmission line 81 and two capacitors, $C_7$ and $C_8$, while the high pass filter 82 includes two transmission liens, 83 and 84, and the capacitor $C_9$. These transmission lines, 81 to 84, have characteristic impedance of 50Ω. The transmission line 81 in the low-pass filter 80 has an electrical length of a quarter wavelength of the local signal LO, where the local signal LO leaked from the transistors, 12 and 14, may be effectively reflected by the transmission line 81. On the other hand, the transmission lines, 83 and 84, in the high-pass filter 82 may have electrical lengths of the quarter wavelength of the output signal RF whose frequency is almost twice the frequency of the local signal LO, where transmission lines, 83 and 84, may be regarded as an open circuit at the frequency of the output signal RF but regarded as a short circuit at frequencies except for the frequency of the output signal RF. The harmonic mixer of the fourth embodiment may suppress the degradation of the conversion efficiency similar to the harmonic mixer of the first embodiment.

The described embodiments focus on the harmonic mixers that process signals with frequencies in quasi-millimeter wavelengths; however, the harmonic mixers of the present invention may process signals having wavelengths outside the quasi-millimeter wavelengths, that is, signals having frequencies greater than about 70 GHz and/or smaller than about 30 GHz.

Also, two local signals, 1LO and 2LO, may have a phase difference substantially enabling the mixing. A phase difference of 180±10° or sometimes 180±20° between two local signals, 1LO and 2LO, may be applicable to the harmonic mixer of the present invention.

The described harmonic mixers mix the local signal LO with the intermediate signal IF to generate the output signal RF. However, the harmonic mixers of the present invention may mix harmonics of the local signal LO with the intermediate signal to generate the output signal RF having a frequency of the harmonics of the local signal LO.

While there has been illustrated and described what are presently considered to be embodiment of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein.

For instance, in the harmonic mixers of the first to fourth embodiments, the transistors, 12 and 14, may be an FET made of compound semiconductor materials, for instance, those of arsenic semiconductors and/or nitride semiconductors, where the former semiconductors include gallium arsenide (GaAs), while latter semiconductors may include gallium nitride (GaN), aluminum gallium nitride (AlGaN), aluminum indium gallium nitride (AlGaInN), and soon. Two transistors, 12 and 14, may be a type of bipolar transistor where bases of the transistors, 12 and 14, receive the local signals, 1LO and 2LO, while emitters or collectors receive the intermediate signal IF, and the rest of the emitters or collectors generates the output signal RF.

Therefore, it is intended that the present invention is not limited to the particular embodiment disclosed, but that the invention include all embodiment falling within the scope of the appended claims.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A harmonic mixer for mixing a local signal LO with an intermediate signal IF to generate an output signal RF that contains frequency components of $2\times f_{LO}\pm f_{IF}$, where $f_{LO}$ and $f_{IF}$ are frequencies of the local signal LO and the intermediate signal IF, respectively, the harmonic mixer comprising:
    an input transmission line coupled to an input terminal that receives the intermediate signal therein;
    an output transmission line coupled to an output terminal that outputs the output signal therefrom;
    a first transistor and a second transistor connected in parallel to each other between the input transmission line and the output transmission line, the first transistor and the second transistor being complementarily driven by the local signal; and
    a balun that receives the local signal and outputs two signal complementary to each other,
    wherein the first transistor is driven by one of the two signals, and the second transistor is driven by another of the two signals.

2. The harmonic mixer of claim 1,
    wherein each of the first transistor and the second transistor has a control terminal, a first current terminal, and a second current terminal, the control terminal controlling current flowing between the first current terminal and the second current terminal, the control terminals of the first transistor and the second transistor receiving the local signal complementarily, the first current terminals being commonly connected to the input transmission line, the second current terminals being commonly connected to the output transmission line.

3. The harmonic mixer of claim 2,
further comprising an inductor connected between the second current terminals commonly connected to each other and a ground.

4. The harmonic mixer of claim 2,
further comprising bias circuits providing bias signals to the control terminals of the first transistor and the second transistor, respectively,
wherein the bias circuits include transmission lines each having an electrical length of a quarter wavelength of the local signal, the bias signals being provided to the control terminals through the respective transmission lines.

5. The harmonic mixer of claim 2,
wherein the first transistor and the second transistor are a type of field effect transistor (FET) having a drain, a gate, and a source, the control terminals corresponding to the gate, the first current terminals corresponding to the drain, and the second current terminals corresponding to the source.

6. A harmonic mixer for mixing a local signal LO with an intermediate signal IF to generate an output signal RF that contains frequency components of $2 \times f_{LO} \pm f_{IF}$, where $f_{LO}$ and $f_{IF}$ are frequencies of the local signal and the intermediate signal IF, respectively, the harmonic mixer comprising:
an input transmission line coupled to an input terminal that receives the intermediate signal therein;
an output transmission line coupled to an output terminal that outputs the output signal therefrom; and
a first transistor and second transistor connected in parallel to each other between the input transmission line and the output transmission line, the first transistor and the second transistor being complementarily driven by the local signal; and
a first filter connected between the input terminal and the input transmission line, the first filter substantially blocking frequency components of the local signal,
wherein the first filter is a low-pass filter including an inductor and two capacitors, the inductor being put between the input transmission line and the input terminal, the capacitors being put between the inductor and a ground, the inductor and the two capacitors forming a π (pi)-arrangement.

7. A harmonic mixed for mixing a local signal LO with an intermediate signal IF to generate an output signal RF that contains frequency components of $2 \times f_{LO} \pm f_{IF}$, where $f_{LO}$ and $f_{IF}$ are frequencies of the local signal and the intermediate signal IF, respectively, the harmonic mixer comprising:
an input transmission line coupled to an input terminal that receives the intermediate signal herein;
an output transmission line coupled to an output terminal that outputs the output signal therefrom; and
a first transistor and second transistor connected in parallel to each other between the input transmission line and the output transmission line, the first transistor and the second transistor being complementarily driven by the local signal; and
a first filter connected between the input terminal and the input transmission line, the first filter substantially blocking frequency components of the local signal,
wherein the first filter is a low-pass filter including a transmission line and two capacitors, the transmission line being put between the input transmission line and the input terminal, the capacitors being put between the transmission line and a ground, the transmission line and the two capacitors forming a π (pi)-arrangement, and
wherein the transmission line has an electrical length corresponding to a quarter wavelength of the local signal.

8. The harmonic mixer of claim 6,
further comprising a second filter put between the output terminal and the output transmission line, the second filter substantially blocking frequency components of the intermediate signal.

9. The harmonic mixer of claim 8,
wherein the second filter is a high-pass filter including a capacitor and two inductors, the capacitor being put between the output transmission line and the output terminal, the inductors being connected to the capacitor and a ground, the capacitor and the two inductors forming a 7C (pi)-arrangement.

10. The harmonic mixer of claim 8,
wherein the second filter is a high-pass filter including a capacitor and two transmission lines, the capacitor being put between the output transmission line and the output terminal, the two transmission lines being put between the capacitor and a ground, the capacitor and the two transmission lines forming a π (pi)-arrangement, and
wherein each of the two transmission lines has an electrical length corresponding to a quarter wavelength of the output signal.

11. The harmonic mixer of claim 1,
wherein the balun is a type of Marchand balun.

* * * * *